(12) United States Patent
Morishima (10) Patent No.: US 7,009,924 B2
(45) Date of Patent: Mar. 7, 2006

(54) CIRCUIT FOR MEASURING PARAMETER OF TIME-BASE ERROR OF PULSE TRAIN, AND OPTICAL DISK RECORDING APPARATUS

(75) Inventor: Morito Morishima, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 628 days.

(21) Appl. No.: 09/920,567

(22) Filed: Aug. 1, 2001

(65) Prior Publication Data

US 2002/0018417 A1    Feb. 14, 2002

(30) Foreign Application Priority Data

Aug. 7, 2000   (JP)   ......................... P. 2000-237926

(51) Int. Cl.
*G11B 5/09*   (2006.01)

(52) U.S. Cl. .............................. 369/47.53; 369/47.28; 369/53.34

(58) Field of Classification Search ............. 369/47.28, 369/47.5, 47.51, 47.53, 53.26, 53.27, 53.31, 369/53.34, 53.44, 116, 124.14
See application file for complete search history.

(56) References Cited

U.S. PATENT DOCUMENTS

| 6,100,724 | A | * | 8/2000 | Yoshimura et al. | ......... 327/100 |
| 2004/0017752 | A1 | | 1/2004 | Furuyima et al. | ........ 369/47.53 |
| 2004/0022151 | A1 | | 5/2004 | Furumiya et al. | ........ 369/47.53 |

FOREIGN PATENT DOCUMENTS

| JP | 08-124163 | 5/1996 |
| JP | 11-273078 | 10/1999 |
| JP | 2000-200418 | 7/2000 |

OTHER PUBLICATIONS

Japanese Office Action for Patent Application 2000-237926, dated Mar. 22, 2005.

* cited by examiner

*Primary Examiner*—Paul W. Huber
(74) *Attorney, Agent, or Firm*—Pillsbury Winthrop Shaw Pittman LLP (57) ABSTRACT

A PLL circuit (24) reproduces a clock signal from a reproduction EFM signal of an optical disk (10). A phase error signal (pco) of the PLL circuit (24) is converted into an absolute value by an absolute value circuit (38), and is averaged for each subcode frame period by an accumulator (40). The recording beam power of a laser beam is determined on the basis of an output of the accumulator (40). A pulse-length discrimination circuit (26) discriminates the pulse length of the reproduction EFM signal. A specific-pulse-length phase-error-signal extracting circuit (42) extracts the phase error signal (pco) of a specific pulse length. The extracted phase error signals (pco) are averaged for the respective subcode frame periods by a accumulator (44). The time base of the corresponding pulse length of the recording EFM signal is corrected on the basis of the output of the accumulator (44).

21 Claims, 9 Drawing Sheets

CIRCUIT FOR MEASURING PARAMETER OF TIME-BASE ERROR OF PULSE TRAIN, AND OPTICAL DISK RECORDING APPARATUS

BACKGROUND OF THE INVENTION

1. Field of the Invention

The present invention relates to a circuit for measuring a parameter of the time-base error of a pulse train and an optical disk recording apparatus using the measuring circuit.

The present application is based on Japanese Patent Application No. 2000-237926, which is incorporated herein by reference.

2. Description of the Related Art

With an optical disk recording apparatus, test recording is performed with respect to an optical disk prior to actual recording, and a time-base error parameter such as jitter is measured with respect to its reproduced pulse train so as to initialize the recording power of the laser beam during actual recording.

SUMMARY OF THE INVENTION

An object of the present invention is to provide a measuring circuit having a novel configuration for measuring a parameter of the time-base error of a pulse train and an optical disk recording apparatus using the measuring circuit.

To this end, according to a first aspect of the present invention, there is provided a measuring circuit which measures a parameter of a time-base error of a pulse train. The measuring circuit comprises: a phase-locked loop including a phase comparator and a variable frequency oscillator, wherein the phase comparator compares phases of an inputted pulse train and a clock signal based on an oscillation output of the variable frequency oscillator to output a phase error signal, and wherein an oscillation frequency of the variable frequency oscillator is variably controlled in correspondence with the phase error signal so as to allow the clock signal to be synchronized with the pulse train; an absolute value circuit which determines absolute values of phase errors consecutively outputted from the phase comparator; and an average value circuit which determines an average value of the absolute values of the phase errors which are consecutively determined, or which determines a value corresponding to the average value, wherein the value determined by the average value circuit is outputted as a measured value of a parameter of a time-base error of the pulse train. The measured value is an average value of the span of the time-base error (or a value corresponding to the average value). For instance, in an optical disk recording apparatus, if the recording beam power of the laser beam is set such that the average value of the span of the time-base error (or a value corresponding to the average value) becomes minimum, it is possible to effect recording in which the time-base error is small for the entire reproduced pulse train. The average value circuit may be configured such that it determines an average value of the absolute values of the phase errors at all edges of the pulse train, or determines a value corresponding to the average value. Further, the average value circuit may be configured as including an accumulator which consecutively accumulates the absolute values of the phase errors, and which determines an accumulated value within a predetermined time duration as the value corresponding to the average value of the absolute values of the phase errors. In addition, the average value circuit maybe configured such that the accumulated value within the predetermined time duration is divided by the number of times of accumulation so as to determine the average value of the absolute values of the phase error, and that the average value is outputted as the measured value of the parameter of the time-base error of the pulse train.

According to a second aspect of the present invention, there is provided an optical disk recording apparatus comprising: the aforementioned measuring circuit of the first aspect of the present invention; a beam-power adjusting circuit which adjusts recording beam power of a laser beam; and a control circuit which controls such that test recording is effected with respect to an optical disk while consecutively varying the recording beam power of the laser beam prior to the recording of the optical disk, the test recording is reproduced after the test recording, a value of the parameter of the time-base error of the reproduced pulse train is measured by the measuring circuit, an appropriate value of the recording beam power of the laser beam during actual recording is determined on the basis of the measured value, and the recording beam power of the laser beam is set to the appropriate value so as to effect actual recording.

According to a third aspect of the present invention, the optical disk recording apparatus of the second aspect of the present invention further comprises: a pulse-train reproducing circuit which reproduces a pulse train corresponding to a recording laser-beam drive signal from a return-light reception signal of the recording laser beam, wherein, during actual recording, the control circuit controls such that the value of the parameter of the time-base error of the pulse train reproduced by the pulse-train reproducing circuit is measured by the measuring circuit, and the recording beam power of the laser beam is consecutively corrected to an appropriate value in real time on the basis of the measure value.

According to a fourth aspect of the present invention, there is provided a measuring circuit which measures a parameter of the time-base error of a pulse train. The measuring circuit comprises: a phase-locked loop including a phase comparator and a variable frequency oscillator, wherein the phase comparator compares phases of an inputted pulse train and a clock signal based on an oscillation output of the variable frequency oscillator to output a phase error signal, and wherein an oscillation frequency of the variable frequency oscillator is variably controlled in correspondence with the phase error signal so as to allow the clock signal to be synchronized with the pulse train; an average value circuit which determines an average value of phase errors consecutively outputted from the phase comparator, or which determines a value corresponding to the average value, wherein the value determined by the average value circuit is outputted as a measured value of the parameter of the time-base error of the pulse train. The measured value represents a time-base error (or a value corresponding to the time-base error) at the center of variation of the time-base error (with respect to a clock signal). For instance, in an optical disk recording apparatus, with respect to specific edges (leading edges or trailing edges) of pulses of a specific pulse length, the timing of the relevant edge of the pulse of the relevant pulse length of the recording laser beam is finely adjusted so as to offset the time-base error at the center of variation of the time-base error, thereby making it possible to effect recording in which the time-base error is small with respect to the relevant edges of the relevant pulse length in the reproduced pulse train. In addition, the fine adjustment is individually made by individually measuring the time-base error at the center of variation of the time-base error at a specific edge (a leading edge or a trailing edge)

with respect to all the pulse lengths, thereby making it possible to effect recording in which the time-base error is small with respect to the relevant edges of all the pulse lengths of the reproduced pulse train. It should be noted that the average value circuit may be configured as including an accumulator which consecutively accumulates the phase errors, and which determines an accumulated value within a predetermined time duration as the value corresponding to the average value of the phase errors. In addition, the average value circuit may be configured such that the accumulated value within the predetermined time duration is divided by the number of times of accumulation so as to determine the average value of the absolute values of the phase error, and that the average value is outputted as the measured value of the parameter of the time-base error of the pulse train.

According to a fifth aspect of the present invention, there is provided an optical disk recording apparatus comprising: the aforementioned measuring circuit of the fourth aspect of the present invention; a time-base correcting circuit which corrects a time base of a recording laser-beam drive signal; and a control circuit which controls such that an amount of time-base correction of the recording laser-beam drive signal is set to a predetermined tentative value prior to the recording of an optical disk, test recording is effected with respect to the optical disk while consecutively varying the recording beam power of the laser beam, the test recording is reproduced after the test recording, a value of the parameter of the time-base error of the reproduced pulse train is measured by the measuring circuit with respect to the test recording recorded with appropriate beam power, the amount of time-base correction of the recording laser-beam drive signal during actual recording is determined on the basis of the measured value, and the amount of time-base correction of the recording laser-beam drive signal is set to the value so as to effect actual recording.

According to a sixth aspect of the present invention, in the aforementioned measuring circuit of the fourth aspect of the present invention, the pulse train has a signal representing digital information on the basis of its pulse length, and measuring the circuit further comprises: a pulse-length discriminating circuit which discriminates the pulse length of one of a pit-corresponding pulse and a blank-corresponding pulse of the pulse train, wherein the average value circuit determines the average value of the phase error at one of a leading edge and a trailing edge of one of the pit-corresponding pulse and the blank-corresponding pulse, or determines a value corresponding to the average value.

According to a seventh aspect of the present invention, there is provided an optical disk recording apparatus comprising: the aforementioned measuring circuit of the sixth aspect of the present invention; a time-base correcting circuit which corrects time base of a recording laser-beam drive signal; and a control circuit which controls such that an amount of time-base correction of the recording laser-beam drive signal is set to a predetermined tentative value prior to the recording of an optical disk, test recording is effected with respect to the optical disk while consecutively varying the recording beam power of the laser beam, the test recording is reproduced after the test recording, values of the parameter of the time-base error of the reproduced pulse train are measured for respective pulse lengths by the measuring circuit with respect to the test recording recorded with appropriate beam power, the amounts of time-base correction of the recording laser-beam drive signal during actual recording are determined for the respective pulse lengths on the basis of the measured values of the parameter of the time-base error, and the amounts of time-base correction of relevant portions of the recording laser-beam drive signal are respectively set to those values so as to effect actual recording.

According to an eighth aspect of the present invention, there is provided a measuring circuit which measures a parameter of a time-base error of a pulse train. The measuring circuit comprises: a phase-locked loop including a phase comparator and a variable frequency oscillator, wherein the phase comparator compares phases of an inputted pulse train and a clock signal based on an oscillation output of the variable frequency oscillator to output a phase error signal, and wherein an oscillation frequency of the variable frequency oscillator is variably controlled in correspondence with the phase error signal so as to allow the clock signal to be synchronized with the pulse train; an absolute value circuit which determines absolute values of phase errors consecutively outputted from the phase comparator; a first average value circuit which determines an average value of the absolute values of the phase errors which are consecutively determined, or which determines a value corresponding to the average value; and a second average value circuit which determines an average value of phase errors consecutively outputted from the phase comparator, or which determines a value corresponding to the average value, wherein the values determined by the first average value circuit and the second average value circuit are respectively outputted as measured values of first and second parameters of the time-base error of the pulse train.

According to a ninth aspect of the present invention, there is provided an optical disk recording apparatus comprising: the aforementioned measuring circuit of the eighth aspect of the present invention; a beam-power adjusting circuit which adjusts recording beam power of a laser beam; a time-base correcting circuit which corrects the time base of a recording laser-beam drive signal; and a control circuit which controls such that an amount of time-base correction of the recording laser-beam drive signal is set to a predetermined tentative value prior to recording of an optical disk, test recording is effected with respect to the optical disk while consecutively varying the recording beam power of the laser beam, the test recording is reproduced after the test recording, a value of the first parameter of the time-base error of the reproduced pulse train is measured by the measuring circuit, an appropriate value of the recording beam power of the laser beam during actual recording is determined on the basis of the measured value, a value of the second parameter of the time-base error of the reproduced pulse train is measured by the measuring circuit with respect to the test recording recorded with appropriate beam power, the amount of time-base correction of the recording laser-beam drive signal during actual recording is determined on the basis of the measured value, the recording beam power of the laser beam is set to the appropriate value, and the amount of time-base correction of the recording laser-beam drive signal is set to the value so as to effect actual recording.

BRIEF DESCRIPTION OF THE DRAWINGS

The above and other objects and advantages of the present invention will become more apparent by describing in detail a preferred embodiment thereof with reference to the accompanying drawings, wherein.

DETAILED DESCRIPTION OF THE PREFERRED EMBODIMENT

Figure 1:
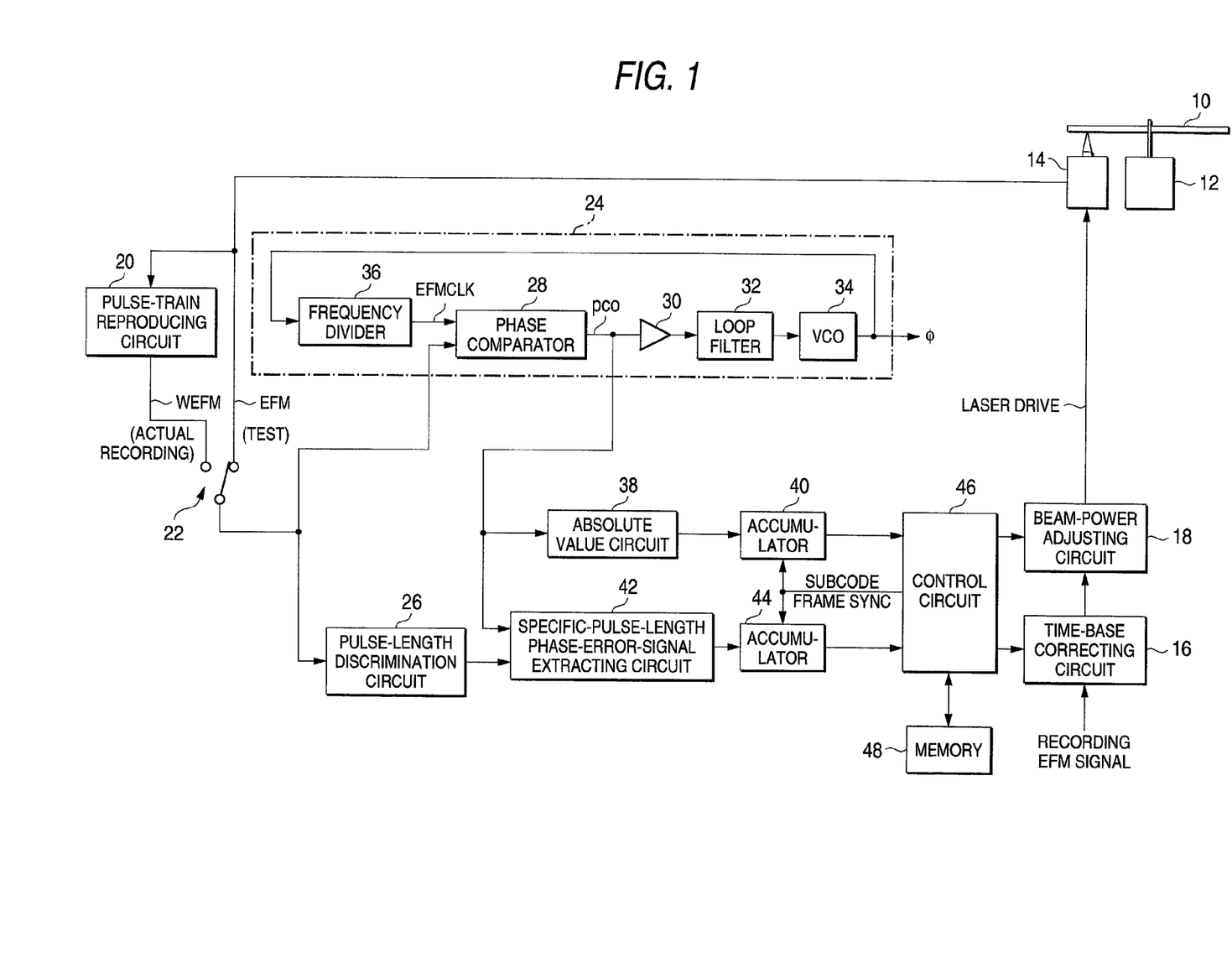
FIG. 1 is a block diagram of principal components illustrating an embodiment of an optical disk recording apparatus of the present invention using a circuit for measuring a parameter of the time-base error of a pulse train in accordance with the present invention.
Figure 2:
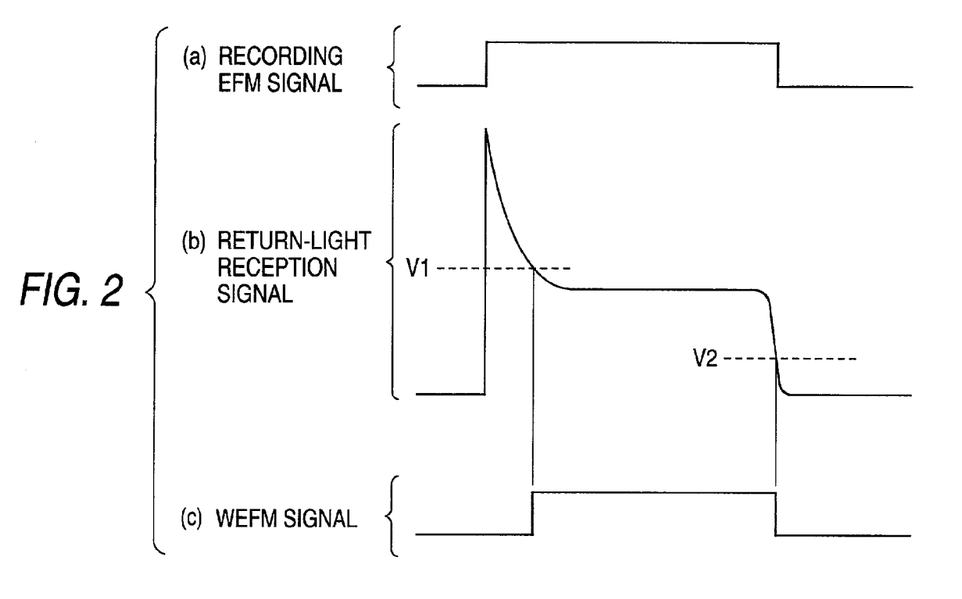
FIG. 2 is a diagram explaining the operation of a pulse-train reproducing circuit 20 shown in FIG. 1.

Referring now to the accompanying drawings, a description will be given of an embodiment of the present invention. FIG. 1 is a block diagram of principal components illustrating an embodiment of an optical disk recording apparatus of the present invention using a circuit for measuring a parameter of the time-base error of a pulse train in accordance with the present invention. Herein, a CD-R/RW (i.e., Compact Disc Recordable/Rewritable) drive, to which the present invention is applied, is shown as one example of the optical disk recording apparatus. In other words, the CD-R/RW drive is also an optical disk recording apparatus capable of recording and reproducing a CD-R and/or a CD-RW. Such an optical disk (i.e., a CD-R, a CD-RW, etc.) 10 is rotatively driven by a spindle motor 12 to effect the recording or reproduction of information by way of an optical pickup 14. During recording, the time base of a recording signal (EFM signal) is corrected by a time-base correcting circuit 16, and the signal level is adjusted by a beam-power adjusting circuit 18 and is supplied to the optical pickup 14 so as to drive a laser source. A laser beam modulated by the recording signal emitted from the laser source is applied to the optical disk 10 to effect the recording of information. At this time, the return light from the optical disk 10 is received by the optical pickup 14, and the waveform of the reception signal is shaped into a signal (hereafter a "WEFM signal") corresponding to its original laser-beam drive signal by a pulse-train reproducing circuit 20. The return-light reception signal of a recording laser beam at the time of forming one pit has a waveform such as the one shown in the part (b) of FIG. 2. Namely, at the beginning when the laser beam of a recording level has started to be irradiated, a change has not yet occurred in the recording layer of the optical disk and the reflectance is high, so that the level of the return-light reception signal is high. As a change occurs in the recording layer, the level of the return-light reception signal drops and converges to a steady level persisting at the time of irradiation of the laser beam of the recording level. When the irradiation is finished, the level of the return-light reception signal drops to a steady level persisting at the time of nonirradiation of the laser beam of the recording level. Accordingly, in the pulse-train reproducing circuit 20, for instance, two reference levels V1 and V2 (V1 is a value which is lower than a peak level during the irradiation of the laser beam of a recording level and is higher than the steady level; V2 is a value which is lower than the peak level during the irradiation of the laser beam of the recording level and is higher than the steady level at the time of the nonirradiation of the laser beam of the recording level). The pulse-train reproducing circuit 20 compares the return-light reception signal with the two reference levels V1 and V2, and generates a WEFM signal, such as the one shown in the part (c) of FIG. 2, which rises when the level of the return-light reception signal has changed from a state higher than V1 to a state lower than V1, and which falls when it has changed from a state higher than V1 to a state lower than V2 as a signal which reproduced the original EFM signal shown in the part (a) of FIG. 2. During reproduction, the optical pickup 14 reads and outputs the recorded information (EFM signal) on the optical disk 10.

A switch 22 is changed over between test recording and actual recording, selects the EFM signal during test recording, selects the WEFM signal during actual recording, and supplies the selected signals to a phase-locked loop (PLL) circuit 24 and a pulse-length discrimination circuit 26, respectively. In the PLL circuit 24, a phase comparator 28 compares the phases of the EFM signal or the WEFM signal with a clock signal (reproduction clock) EFMCLK reproduced by the PLL circuit 24 for each edge (a leading edge and a trailing edge) of the EFM signal or the WEFM signal, outputs a difference signal (phase error signal) pco representing a difference between the two signals. The signal pco is smoothed by a loop filter 32 via an amplifier 30, and the smoothed signal is supplied to a control input terminal of a voltage-controlled oscillator (VCO) 34 so as to control its oscillation frequency. A signal Ø oscillated from the VCO 34 is subjected to frequency division by a frequency divider 36, and is inputted to the phase comparator 28 as the reproduction clock EFMCLK. Through this phase-locked loop, the oscillation frequency of the VCO 34 is controlled such that the reproduction clock EFMCLK is phase-locked with the EFM signal or the WEFM signal. The signal Ø oscillated from the VCO 34 is used for demodulation processing and the like of the EFM signal.

An absolute value circuit 38 converts the phase error signal pco outputted for each edge of the EFM signal or the WEFM signal from the phase comparator 28 into an absolute value. An accumulator 40 accumulates the phase error signals pco converted into absolute values, and consecutively outputs accumulated values for respective subcode frame periods (98 EFM frame periods) as values corresponding to average values of the span of phase errors in the relevant subcode frames. The pulse-length discrimination circuit 26 discriminates the pulse length of the EFM signal or the WEFM signal. A specific-pulse-length phase-error-signal extracting circuit 42 extracts the phase error signals pco at specific edges (leading edges or trailing edges) with respect to pulses of a specific pulse length discriminated by the pulse-length discrimination circuit 26 among the phase error signals pco from the phase comparator 28. An accumulator 44 accumulates the extracted phase error signals pco, and consecutively outputs the accumulated values for the respective subcode frame periods as values each corresponding to the phase error at the center of variation of the phase error concerning a relevant edge of the pulse of a relevant pulse length in each subcode frame.

Figure 3:
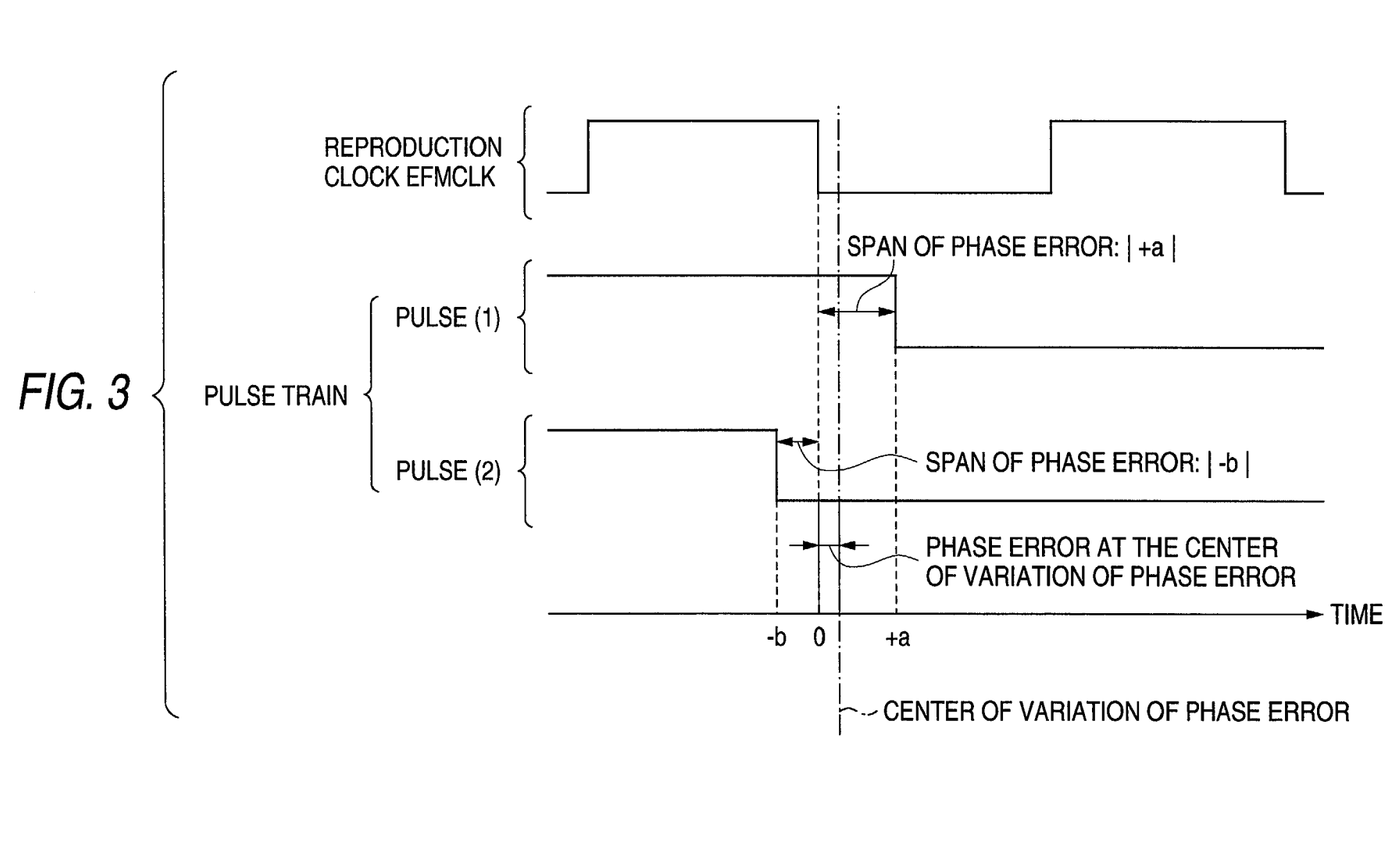
FIG. 3 is a diagram explaining the meanings of an average value of the span of the phase error (time-base error) and the phase error (time-base error) at the center of variation of the phase error (time-base error)

Referring to FIG. 3, a description will be given of the meanings of the average value of the span of the phase error (time-base error) and the phase error (time-base error) at the center of variation of the phase error (time-base error). FIG. 3 shows an example of the phase relationship between the reproduction clock EFMCLK and an input pulse train (the EFM signal or the WEFM signal).

As for this input pulse train, it is assumed that a pulse (1) is inputted at one point of time, and that a pulse (2) is inputted at another point of time. The phase errors at the edges of the pulses (1) and (2) with respect to the edge of the EFM signal or the WEFM signal are +a and −b, respectively. At this time, the average value of the span of phase errors of the pulses (1) and (2) can be expressed as follows.

$$(|+a|+|-b|)/2=(a+b)/2$$

Meanwhile, the phase error at the center of variation of the phase error can be expressed as follows.

$$\{(+a)+(-b)\}/2=(a-b)/2$$

The accumulator 40 accumulates the span of phase errors (absolute values of phase errors) with respect to all the edges of the EFM signal or the WEFM signal in one subcode frame period. However, since the number of edges (leading edges and trailing edges) of the EFM signal or the WEFM signal in one subcode frame period is substantially fixed, the accumulator 40 outputs this accumulated value as it is as a value corresponding to the average value of the span of phase errors at all the edges in one subcode frame period. Similarly, the accumulator 44 accumulates phase errors with respect to specific edges (leading edges or trailing edges) of pulses of a specific pulse length in the EFM signal or the WEFM signal in one subcode frame period. However, since the number of specific edges of pulses of a specific pulse length in the EFM signal or the WEFM signal in one subcode frame period is substantially fixed, the accumulator 44 outputs this accumulated value as it is as a value corresponding to the phase error at the center of variation of the phase error at specific edges of pulses of the specific pulse length in one subcode frame period. It should be noted that the number of times of accumulation by the accumulator 40 in one subcode frame period may be counted, and the accumulated value of the accumulator 40 in one subcode frame period may be divided by that number of times of accumulation so as to accurately determine the average value of the span of phase errors in one subcode frame period. Similarly, the number of times of accumulation by the accumulator 44 in one subcode frame period may be counted, and the accumulated value of the accumulator 44 in one subcode frame period may be divided by that number of times of accumulation so as to accurately determine the phase error at the center of variation of the phase error in one subcode frame period.

Figure 4:
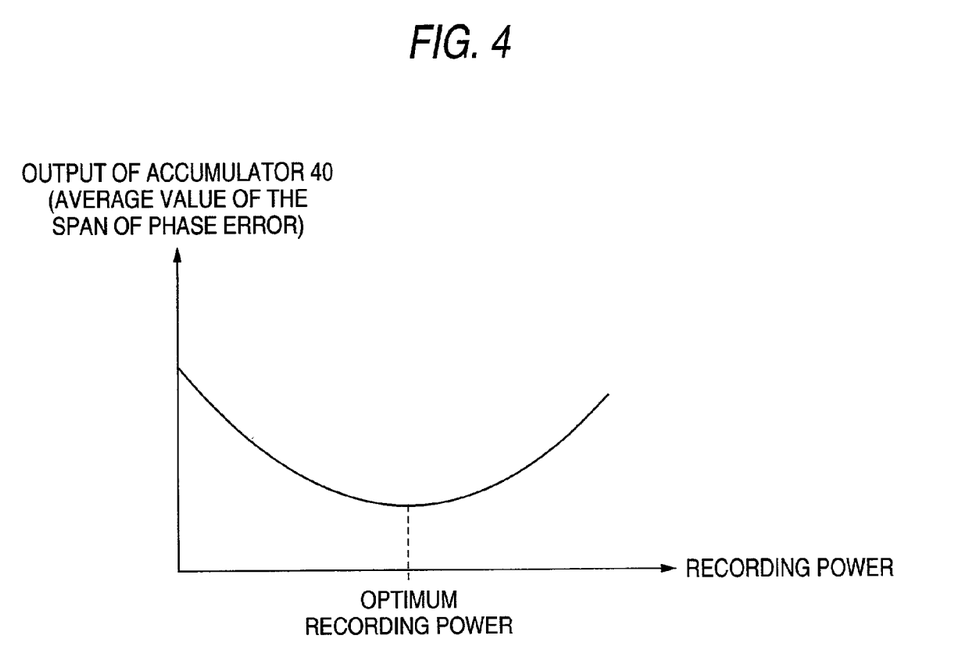
FIG. 4 is a characteristic diagram of change of an output (an average of the span of the phase error) of an accumulator with respect to the recording power of a recording laser beam.

A control circuit 46 effects test recording by consecutively varying the recording power (beam power) of the recording laser beam in an optimum power control (OPC) region of the optical disk 10 prior to actual recording, and with respect to its reproduction signal (EFM signal), the control circuit 46 determines optimum recording power for minimizing the phase error of the entire EFM signal on the basis of accumulated values (values obtained by converting the phase error signals pco at all the edges of the EFM signal into absolute values and by accumulating them with respect to the subcode frame period) for the respective recording power outputted from the accumulator 40. Namely, since the output (a value corresponding to the average value of the span of phase errors) from the accumulator 40 with respect to the recording power of the recording laser beam changes as shown in FIG. 4, for example, the recording power which minimizes the accumulated value of the accumulator 40 is determined as optimum recording power.

Figure 5:
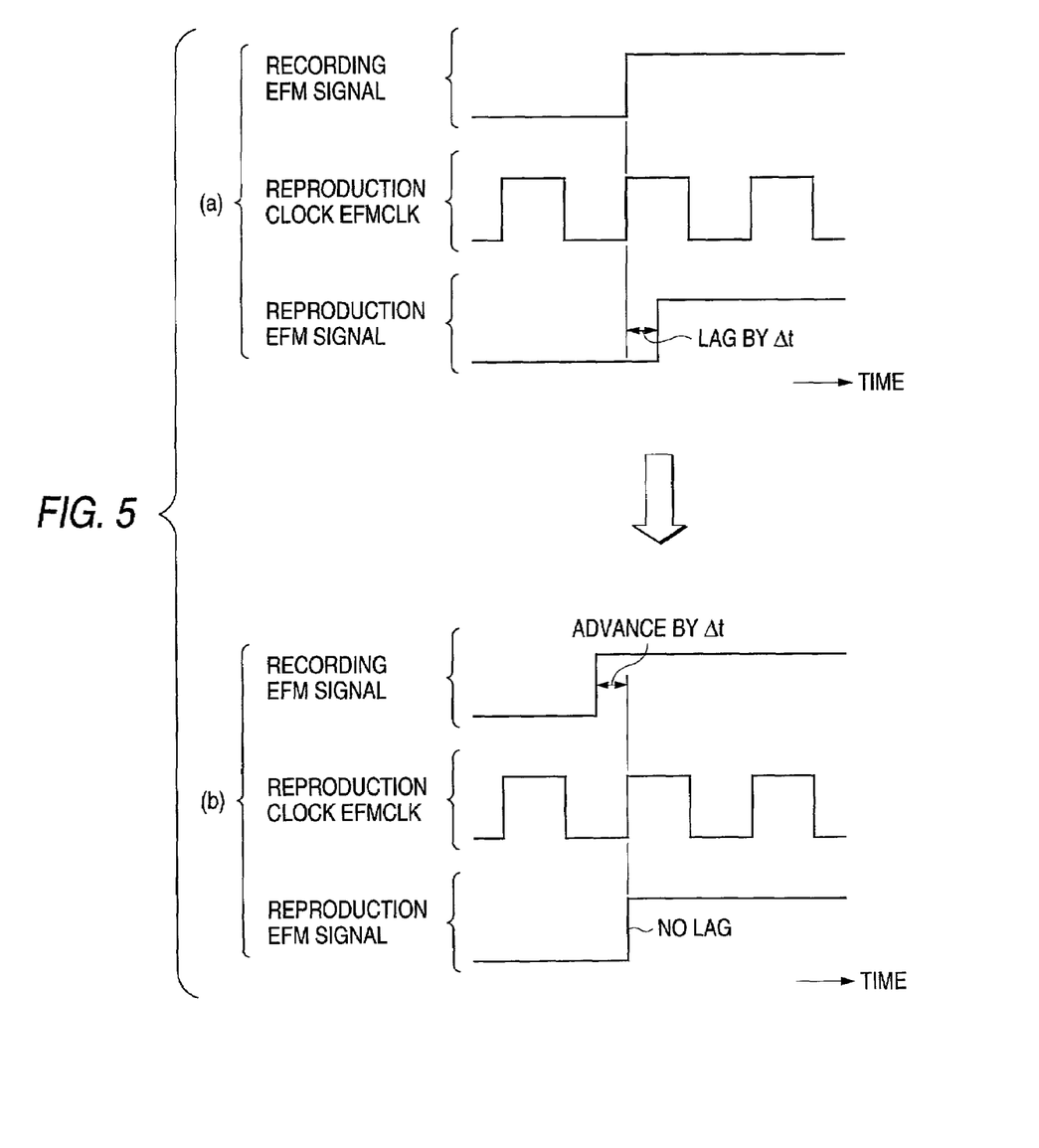
FIG. 5 is a diagram explaining the time-base correction.

In addition, the control circuit 46 determines the phase error at the center of variation of the phase error at the relevant edge of the pulse of the relevant pulse length on the basis of an output of the accumulator 44 (an accumulated value in which the phase error signals pco at the leading edges or trailing edges of pulses of a specific pulse length in the EFM signal are accumulated with respect to one subcode frame period), and determines an amount of time-base correction (an amount of correction of a rising timing or a falling timing of the pulse) of a relevant portion of the recording laser beam necessary for correcting that phase error. For example, in a case where as a result of reproducing the test recording using optimum recording power, the edge of the pulse of a specific pulse length in the reproduced EFM signal is delayed by Δt with respect to the reproduction clock EFMCLK as shown in the part (a) of FIG. 5, by setting the amount of time-base correction to Δt (lead) so as to offset the phase error Δt (lag) as shown in the part (b) of FIG. 5, the time-base correction is effected for advancing by Δt the relevant edge of the pulse of the relevant pulse length in the recording EFM signal, thereby obtaining a reproduction EFM signal whose edge phase coincides with the reproduction clock EFMCLK. The control circuit 46 consecutively changes over the pulse length which is extracted by the specific-pulse-length phase-error-signal extracting circuit 42, and consecutively determines the amount of time-base correction at the leading edge and/or trailing edge for each pulse length (namely, with respect to a plurality of appropriately selected pulse lengths or all the pulse lengths (3T to 11T)). The optimum recording power and the amount of time-base correction for each pulse length which are thus determined are recorded in a memory 48. During actual recording, the control circuit 46 sets the initial value of the recording beam power of the laser beam and an initial value of the amount of time-base correction of the recording laser beam to the values stored in the memory, respectively, and effects the actual recording.

It should be noted that the setting of the amount of time-base correction based on the measurement of the phase error at the center of variation of the phase error can be effected with respect to a pit-corresponding pulse by using either one of the following methods (a) and (b) or by combining the two methods as follows.

(a) The amount of time-base correction of a leading edge of the pit-corresponding pulse of the recording signal for each pit length is set on the basis of the result of measurement of the leading edge of the pit-corresponding pulse of the reproduction signal for each pit length.

(b) The amount of time-base correction of a trailing edge of the pit-corresponding pulse of the recording signal for each pit length is set on the basis of the result of measurement of the trailing edge of the pit-corresponding pulse of the reproduction signal for each pit length.

In addition, in a case where the amount of time-base correction is determined with respect to a blank-corresponding pulse instead of the pit-corresponding pulse, the setting of the amount of time-base correction can be effected by using either one of the following methods (c) and (d) or by combining the methods (c) and (d).

(c) The amount of time-base correction of a leading edge of the blank-corresponding pulse of the recording signal for each blank length is set on the basis of the result of measurement of the leading edge of the blank-corresponding pulse of the reproduction signal for each blank length.

(d) The amount of time-base correction of a trailing edge of the blank-corresponding pulse of the recording signal for each blank length is set on the basis of the result of measurement of the trailing edge of the blank-corresponding pulse of the reproduction signal for each blank length.

During actual recording, the control circuit 46 subjects the WEFM signal reproduced by the pulse-train reproducing circuit 20 to the same processing as that concerning the EFM signal, when necessary, and acquires from the accumulator 40 a value corresponding to an average value of the span of phase errors of the entire pulse train. In correspondence with that value, the control circuit 46 corrects the recording power in real time so as to cause the recording power to follow the variation of optimum recording power due to a temperature change and the like. In parallel with this processing, the control circuit 46 acquires from the accumulator 44 a value corresponding to the phase error at the center of variation of the phase error for each pulse length, and corrects in real time the amount of time-base correction of the pulse length corresponding to that value so as to cause the amount of time-base correction to follow the variation of the time-base error due to a temperature change and the like.

Figure 6:
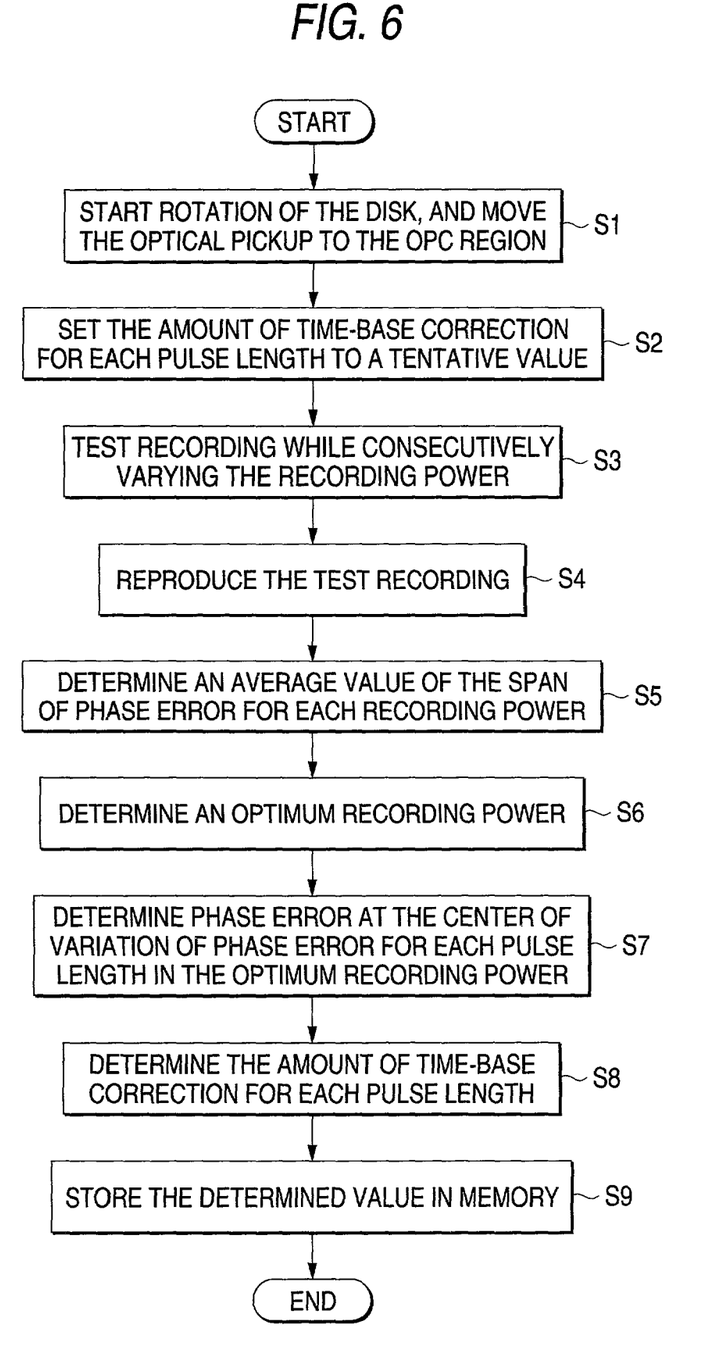
FIG. 6 is a flowchart of control by a control circuit 46 during test recording.

A flowchart of control by the control circuit 46 during test recording is shown in FIG. 6. The rotation of the optical disk 10 is started, and the optical pickup 14 is moved to the OPC region of the optical disk 10 (S1). The amount of time-base correction for each pulse length is tentatively set (S2). Test recording is effected while consecutively changing the recording power (S3). After the test recording, the test recording is reproduced (S4). A value corresponding to the average value of the span of phase errors for each recording power is determined (S5). The recording power which renders the accumulated value of the accumulator 40 minimum is determined as optimum recording power (S6). The test recording recorded with the optimum recording power is repeatedly reproduced, and a value corresponding to the phase error at the center of variation of the phase error is determined by the accumulator 44 with respect to the leading edge or the trailing edge for each pulse length (S7). Hence, a value which offsets the phase error at the center of variation of that phase error is determined as the amount of time-base correction (S8). The optimum recording power and the amount of time-base correction thus determined are recorded in the memory 48 (S9).

Figure 7:
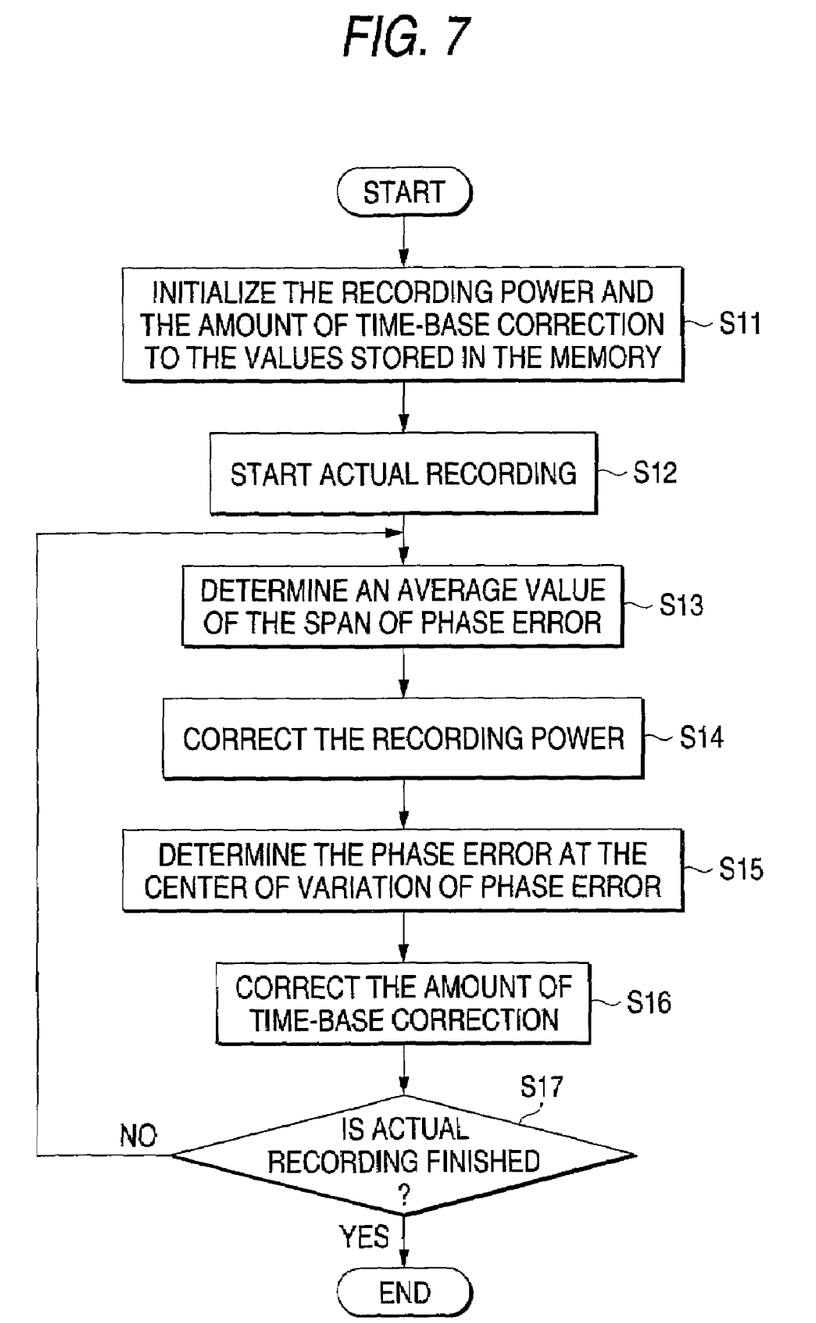
FIG. 7 is a flowchart of control by a control circuit 46 during actual recording.

A flowchart of control by the control circuit 46 during actual recording is shown in FIG. 7. The recording power and the amount of time-base correction are initialized to the values stored in the memory 48 (S11), and actual recording is started (S12). During actual recording, a value corresponding to the average value of the span of the phase error is determined from the output of the accumulator 40 (S13), and the recording power is corrected in real time so that the value corresponding to the average value of the span of the phase error is kept at a minimum value (S14). As a method therefor, for example, the value corresponding to the average value of the span of the phase error, which is measured from the output of the accumulator 40 at the beginning of actual recording, is set as a target value, and the recording power is controlled in real time such that the value corresponding to the average value of the span of the phase error which is measured from the output of the accumulator 40 during actual recording is kept at the target value or a value closest to the target value. Alternatively, during actual recording, the recording power is oscillated vertically by very small amounts centering on the present recording power, and the value corresponding to the average value of the span of the phase error is measured from the output of the accumulator 40. Further, the recording power is consecutively varied in the direction in which the value corresponding to the average value becomes smaller, whereupon the recording power at which the value corresponding to the average value shows a minimum value is searched, and control for holding the recording power at that value is repeatedly executed periodically.

In parallel with the real-time control of the recording power, the phase error at the center of variation of the phase error is determined for each pulse length from the output of the accumulator 44 (S15), and the amount of time-base correction is consecutively corrected so as to offset that phase a error (S16). This real time correction of the recording power and the amount of time-base correction is repeated, as required, until the end of recording (S17).

Figure 8:
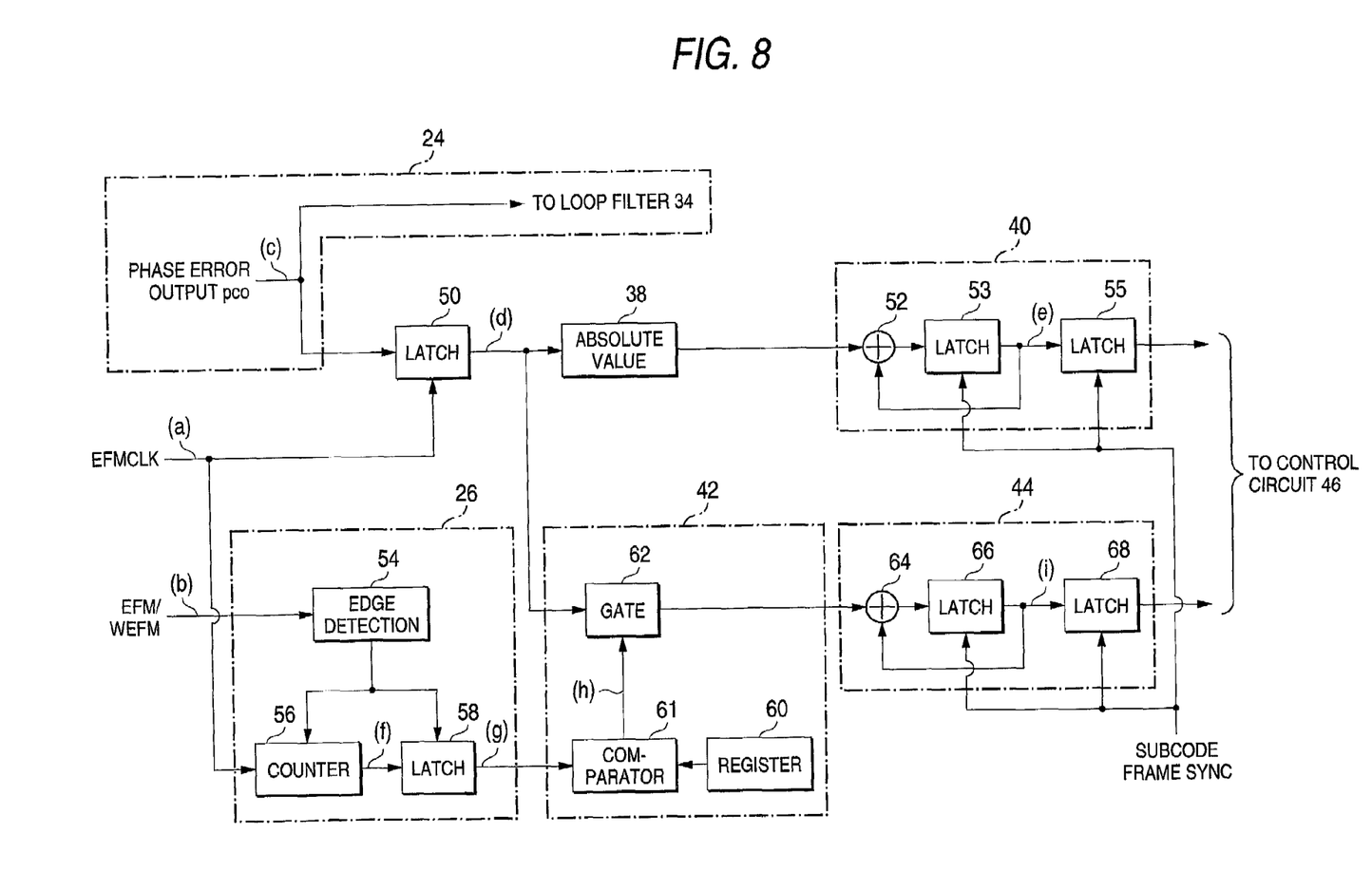
FIG. 8 is a block diagram illustrating an example of the circuit configuration in a case where a measuring circuit portion of the circuitry shown in FIG. 1 is configured by digital circuits.

FIG. 8 shows an example of the circuit configuration in a case where the measuring circuit portion of the circuitry shown in FIG. 1 is configured by digital circuits. The PLL circuit 24 is configured by a known digital PLL circuit, for example. The phase error output pco of the PLL circuit is latched by a latch circuit 50 using the reproduction clock EFMCLK, is converted into an absolute value by the absolute value circuit 38, and is inputted to the accumulator 40. The accumulator 40 consecutively accumulates the phase error outputs converted into absolute values through a loop having an adder 52 and a latch circuit 53, and an accumulated value for each subcode frame period is latched by a latch circuit 55 and is outputted as the value corresponding to the average value of the span of the phase error of the entire pulse train.

In the pulse-length discrimination circuit 26, a rising edge and a falling edge of the EFM signal or the WEFM signal are detected by an edge detection circuit 54. A counter 56 is reset by one edge (e.g., the rising edge) of the EFM signal or the WEFM signal, and counts up the reproduction clock EFM-CLK. The counted value is latched by a latch circuit 58 at the other edge (e.g., the falling edge) of the EFM signal or the WEFM signal. This latched value corresponds to the pulse length of the EFM signal or the WEFM signal. In the specific-pulse-length phase-error-signal extracting circuit 42, a designated value of the pulse length is held in a register 60. A comparator 61 makes a comparison between this designated value of the pulse length and the detected value of the pulse length from the latch circuit 58, and if the two values agree with each other, a gate circuit 62 is opened to extract the phase error signal at one edge (e.g., the rising edge) of the relevant pulse. The accumulator 44 consecutively accumulates the extracted phase error signals through a loop having an adder 64 and a latch circuit 66, and an accumulated value for each subcode frame period is latched by a latch circuit 68 and is outputted as the value corresponding to the average value of the span of the phase error of the entire pulse train. The designated value of the pulse length held in the register 60 is consecutively changed over, and the phase error at the center of variation of the phase error is consecutively measured for each pulse length.

Figure 9:
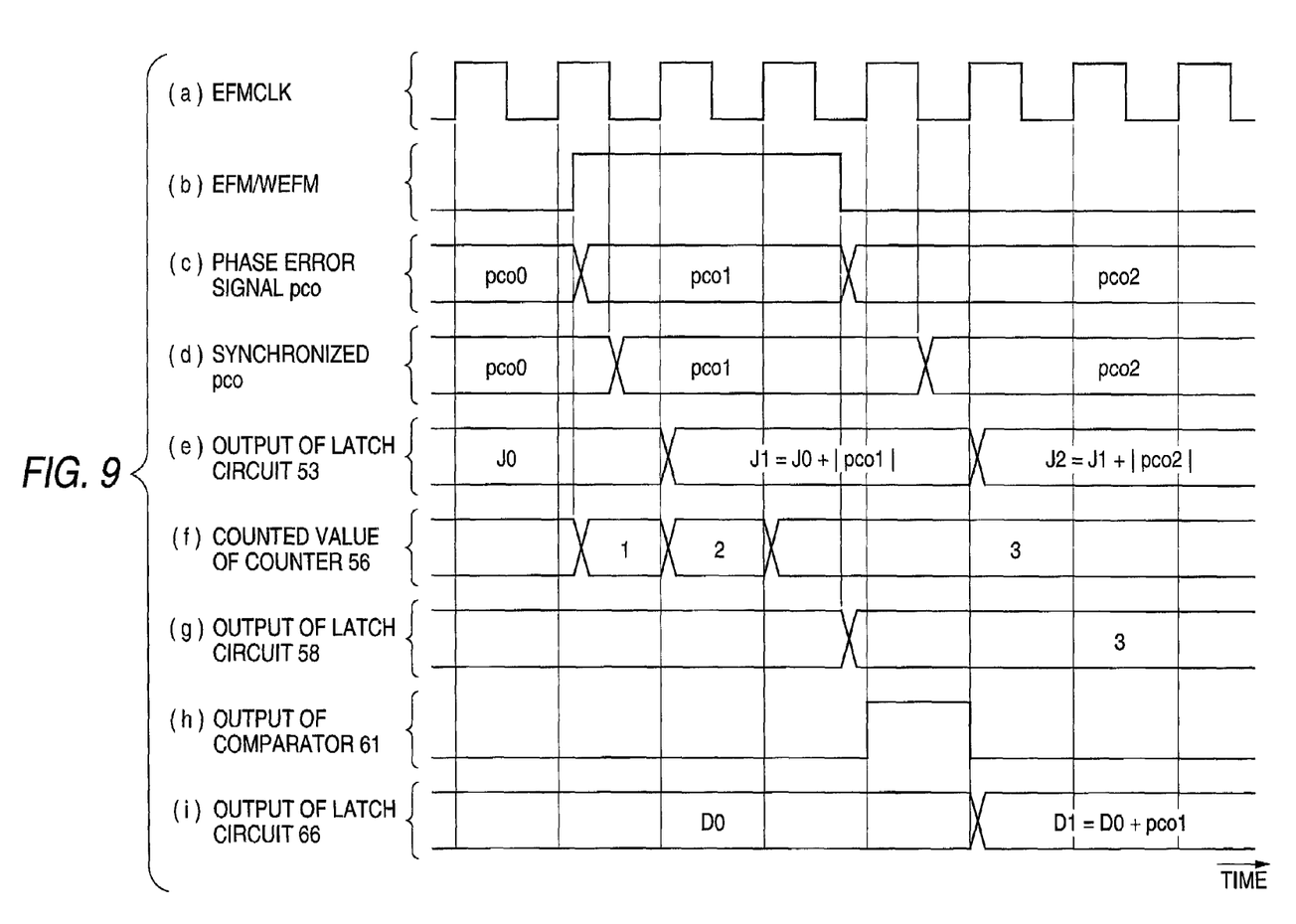
FIG. 9 is a timing chart illustrating an example of the operation of the circuits shown in FIG. 8.

An example of the operation of the circuits shown in FIG. 8 is shown in FIG. 9. In FIG. 9, the parts (a) to (g) show signals or data at portions indicated by the same reference characters in FIG. 8. The phase error is detected (c) at each edge of the reproduction EFM signal (b), is synchronized (d) at the fall of the reproduction clock EFMCLK (a) by the latch circuit 50, is converted into an absolute value by the absolute value circuit 38, and is accumulated (e) by the accumulator 40. In addition, if it is assumed that 3T has been designated as the pulse length by the register 60, at the point of time (f) when the detection of the 3T pulse by the comparator 61 has been finished, the phase error signal pcol at the leading edge of the 3T pulse is extracted by the gate circuit 62, and is accumulated (g) by the accumulator 44.

It should be noted that although, in the above-described embodiment, the measurement of the phase error at the center of variation of the phase error is consecutively effected from each pulse length, if an arrangement is provided such that the phase error signal is distributed for each pulse length and the accumulation is effected in parallel for the pulse lengths, it is possible to effect the phase error at the center of variation of the phase error for each pulse length simultaneously in parallel. In addition, the measuring circuit in accordance with the present invention is also applicable to a case where a time-base error parameter is measured with respect to a reproduction signal or a return-light reception signal during recording on an optical disk (e.g., a DVD-R (i.e., Digital Versatile Disk Recordable) etc.) other than the CD-R/RW, and to a case where a time-base error parameter is measured with respect to a reproduction signal of a recording medium other than the optical disk. Furthermore, the optical disk recording apparatus in accordance with the present invention is also applicable to an optical disk recording apparatus (e.g., a DVD-R drive and the like) other than the CD-R/RW drive.

What is claimed is:

1. An optical disk recording apparatus, comprising:
   a measuring circuit which measures a parameter of a time-base error of a pulse train, the measuring circuit comprising:
   a phase-locked loop including a phase comparator and a variable frequency oscillator, wherein the phase comparator compares phases of an inputted pulse train and a clock signal based on an oscillation output of the variable frequency oscillator to output a phase error signal, and wherein an oscillation frequency of the variable frequency oscillator is variably controlled in correspondence with the phase error signal so as to allow the clock signal to be synchronized with the pulse train;
   an absolute value circuit which determines absolute values of phase errors consecutively outputted from the phase comparator; and
   an average value circuit which determines an average value of the absolute values of the phase errors which are consecutively determined, or which determines a value corresponding to the average value,
   wherein the value determined by the average value circuit is outputted as a measured value of a parameter of a time-base error of the pulse train;
   a beam-power adjusting circuit which adjusts recording beam power of a laser beam; and
   a control circuit which controls such that test recording is effected with respect to an optical disk while consecutively varying the recording beam power of the laser beam prior to the recording of the optical disk, the test recording is reproduced after the test recording, a value of the parameter of the time-based error of the reproduced pulse train is measured by the measuring circuit, an appropriate value of the recording beam power of the laser beam during actual recording is determined on the basis of the measured value, and the recording beam power of the laser beam is set to the appropriate value so as to effect actual recording.

2. The optical disk recording apparatus according to claim 1, further comprising:
   a pulse-train reproducing circuit which reproduces a pulse train corresponding to a recording laser-beam drive signal from a return-light reception signal of the recording laser beam,
   wherein, during actual recording, the control circuit controls such that the value of the parameter of the time-base error of the pulse train reproduced by the pulse-train reproducing circuit is measured by the measuring circuit, and the recording beam power of the laser beam is consecutively corrected to an appropriate value in real time on the basis of the measure value.

3. The optical disk recording apparatus according to claim 1, wherein the average value circuit determines an average value of the absolute values of the phase errors at all edges of the pulse train, or determines a value corresponding to the average value.

4. The optical disk recording apparatus according to claim 1, wherein the average value circuit includes an accumulator which consecutively accumulates the absolute values of the phase errors, and which determines an accumulated value within a predetermined time duration as the value corresponding to the average value of the absolute values of the phase errors.

5. The optical disk recording apparatus according to claim 3, wherein the average value circuit includes an accumulator which consecutively accumulates the absolute values of the phase errors, and which determines an accumulated value within a predetermined time duration as the value corresponding to the average value of the absolute values of the phase errors.

6. A measuring circuit which measures a parameter of the time-base error of a pulse train, the measuring circuit comprising:
   a phase-locked loop including a phase comparator and a variable frequency oscillator, wherein the phase comparator compares phases of an inputted pulse train and a clock signal based on an oscillation output of the variable frequency oscillator to output a phase error signal, and wherein an oscillation frequency of the variable frequency oscillator is variably controlled in correspondence with the phase error signal so as to allow the clock signal to be synchronized with the pulse train; and
   an average value circuit which determines an average value of phase errors consecutively outputted from the phase comparator, or which determines a value corresponding to the average value,
   wherein the value determined by the average value circuit is outputted as a measured value of the parameter of the time-base error of the pulse train, and the pulse train has a signal representing digital information on the basis of its pulse length, and the measuring circuit further includes:
   a pulse-length discriminating circuit which discriminates a pulse length of one of a pit-corresponding pulse and a blank-corresponding pulse of the pulse train,
   wherein the average value circuit determines the average value of the phase error at one of a leading edge and a trailing edge of the pit-corresponding pulse, or determines a value corresponding to the average value.

7. The measuring circuit according to claim 6, wherein the average value circuit includes an accumulator which consecutively accumulates the phase errors, and which determines an accumulated value within a predetermined time duration as the value corresponding to the average value of the phase errors.

8. A measuring circuit which measures a parameter of the time-base error of a pulse train, the measuring circuit comprising:
- a phase-locked loop including a phase comparator and a variable frequency oscillator, wherein the phase comparator compares phases of an inputted pulse train and a clock signal based on an oscillation output of the variable frequency oscillator to output a phase error signal, and wherein an oscillation frequency of the variable frequency oscillator is variably controlled in correspondence with the phase error signal so as to allow the clock signal to be synchronized with the pulse train; and
- an average value circuit which determines an average value of phase errors consecutively outputted from the phase comparator, or which determines a value corresponding to the average value,
- wherein the value determined by the average value circuit is outputted as a measured value of the parameter of the time-base error of the pulse train and the pulse train has a signal representing digital information on the basis of its pulse length, and the measuring circuit further includes:
- a pulse-length discriminating circuit which discriminates a pulse length of one of a pit-corresponding pulse and a blank-corresponding pulse of the pulse train,
- wherein the average value circuit determines the average value of the phase error at one of a leading edge and a trailing edge of the blank-corresponding pulse, or determines a value corresponding to the average value.

9. The measuring circuit according to claim 8, wherein the average value circuit includes an accumulator which consecutively accumulates the phase errors, and which determines an accumulated value within a predetermined time duration as the value corresponding to the average value of the phase errors.

10. An optical disk recording apparatus, comprising:
- a measuring circuit which measures a parameter of the time-base error of a pulse train, the measuring circuit comprising:
- a phase-locked loop including a phase comparator and a variable frequency oscillator, wherein the phase comparator compares phases of an inputted pulse train and a clock signal based on an oscillation output of the variable frequency oscillator to output a phase error signal, and wherein an oscillation frequency of the variable frequency oscillator is variably controlled in correspondence with the phase error signal so as to allow the clock signal to be synchronized with the pulse train; and
- an average value circuit which determines an average value of phase errors consecutively outputted from the phase comparator, or which determines a value corresponding to the average value,
- wherein the value determined by the average value circuit is outputted as a measured value of the parameter of the time-base error of the pulse train;
- a time-base correcting circuit which corrects a time base of a recording laser-beam drive signal; and
- a control circuit which controls such that an amount of time-base correction of the recording laser-beam drive signal is set to a predetermined tentative value prior to recording of an optical disk, test recording is effected with respect to the optical disk while consecutively varying the recording beam power of the laser-beam, the test recording is reproduced after the test recording, a value of the parameter of the time-base error of the reproduced pulse train is measured by the measuring circuit with respect to the test recording recorded with appropriate beam power, the amount of time-base correction of the recording laser-beam drive signal during actual recording is determined on the basis of the measured value, and the amount of time-base correction of the recording laser-beam drive signal is set to the value so as to effect actual recording.

11. The optical disk recording apparatus according to claim 10, wherein the average value circuit includes an accumulator which consecutively accumulates the phase errors, and which determines an accumulated value within a predetermined time duration as the value corresponding to the average value of the phase errors.

12. An optical disk recording apparatus, comprising:
- a measuring circuit which measures a parameter of the time-base error of a pulse train, the measuring circuit comprising:
- a phase-locked loop including a phase comparator and a variable frequency oscillator, wherein the phase comparator compares phases of an inputted pulse train and a clock signal based on an oscillation output of the variable frequency oscillator to output a phase error signal, and wherein an oscillation frequency of the variable frequency oscillator is variably controlled in correspondence with the phase error signal so as to allow the clock signal to be synchronized with the pulse train; and
- an average value circuit which determines an average value of phase errors consecutively outputted from the phase comparator, or which determines a value corresponding to the average value,
- wherein the value determined by the average value circuit is outputted as a measured value of the parameter of the time-base error of the pulse train, and
- wherein the pulse train has a signal representing digital information on the basis of its pulse length, and the measuring circuit further comprises:
- a pulse-length discriminating circuit which discriminates a pulse length of one of a pit-corresponding pulse and a blank-corresponding pulse of the pulse train,
- wherein the average value circuit determines the average value of the phase error at one of a leading edge and a trailing edge of the pit-corresponding pulse, or determines a value corresponding to the average value;
- a time-base correcting circuit which corrects a time base of a recording laser-beam drive signal; and
- a control circuit which controls such that an amount of time-base correction of the recording laser-beam drive signal is set to a predetermined tentative value prior to recording of an optical disk, test recording is effected with respect to the optical disk while consecutively varying the recording beam power of the laser beam, the test recording is reproduced after the test recording, values of the parameter of the time-base error of the reproduced pulse train are measured for respective pulse lengths by the measuring circuit with respect to the test recording recorded with appropriate beam power, the amounts of time-base correction of the recording laser-beam drive signal during actual recording are determined for the respective pulse lengths on the basis of the measured values of the parameter of the time-base error, and the amounts of time-base correction of relevant portions of the recording laser-beam drive signal are respectively set to those values so as to effect actual recording.

13. The optical disk recording apparatus according to claim 12, wherein the average value circuit includes an accumulator which consecutively accumulates the phase errors, and which determines an accumulated value within a predetermined time duration as the value corresponding to the average value of the phase errors.

14. An optical disk recording apparatus, comprising:
a measuring circuit which measures a parameter of the time-base error of a pulse train, the measuring circuit comprising:
a phase-locked loop including a phase comparator and a variable frequency oscillator, wherein the phase comparator compares phases of an inputted pulse train and a clock signal based on an oscillation output of the variable frequency oscillator to output a phase error signal, and wherein an oscillation frequency of the variable frequency oscillator is variably controlled in correspondence with the phase error signal so as to allow the clock signal to be synchronized with the pulse train; and
an average value circuit which determines an average value of phase errors consecutively outputted from the phase comparator, or which determines a value corresponding to the average value,
wherein the value determined by the average value circuit is outputted as a measured value of the parameter of the time-base error of the pulse train, and
wherein the pulse train has a signal representing digital information on the basis of its pulse length, and the measuring circuit further comprises:
a pulse-length discriminating circuit which discriminates a pulse length of one of a pit-corresponding pulse and a blank-corresponding pulse of the pulse train,
wherein the average value circuit determines the average value of the phase error at one of a leading edge and a trailing edge of the blank-corresponding pulse, or determines a value corresponding to the average value;
a time-base correcting circuit which corrects a time base of a recording laser-beam drive signal; and
a control circuit which controls such that an amount of time-base correction of the recording laser-beam drive signal is set to a predetermined tentative value prior to recording of an optical disk, test recording is effected with respect to the optical disk while consecutively varying the recording beam power of the laser beam, the test recording is reproduced after the test recording, values of the parameter of the time-base error of the reproduced pulse train are measured for respective pulse lengths by the measuring circuit with respect to the test recording recorded with appropriate beam power, the amounts of time-base correction of the recording laser-beam drive signal during actual recording are determined for the respective pulse lengths on the basis of the measured values of the parameter of the time-base error, and the amounts of time-base correction of relevant portions of the recording laser-beam drive signal are respectively set to those values so as to effect actual recording.

15. The optical disk recording apparatus according to claim 14, wherein the average value circuit includes an accumulator which consecutively accumulates the phase errors, and which determines an accumulated value within a predetermined time duration as the value corresponding to the average value of the phase errors.

16. A measuring circuit which measures a parameter of a time-base error of a pulse train, the measuring circuit comprising:
a phase-locked loop including a phase comparator and a variable frequency oscillator, wherein the phase comparator compares phases of an inputted pulse train and a clock signal based on an oscillation output of the variable frequency oscillator to output a phase error signal, and wherein an oscillation frequency of the variable frequency oscillator is variably controlled in correspondence with the phase error signal so as to allow the clock signal to be synchronized with the pulse train;
an absolute value circuit which determines absolute values of phase errors consecutively outputted from the phase comparator;
a first average value circuit which determines an average value of the absolute values of the phase errors which are consecutively determined, or which determines a value corresponding to the average value; and
a second average value circuit which determines an average value of phase errors consecutively outputted from the phase comparator, or which determines a value corresponding to the average value,
wherein the values determined by the first average value circuit and the second average value circuit are respectively outputted as measured values of first and second parameters of the time-base error of the pulse train.

17. An optical disk recording apparatus, comprising:
a measuring circuit which measures a parameter of a time-base error of a pulse train, the measuring circuit comprising:
a phase-locked loop including a phase comparator and a variable frequency oscillator, wherein the phase comparator compares phases of an inputted pulse train and a clock signal based on an oscillation output of the variable frequency oscillator to output a phase error signal, and wherein an oscillation frequency of the variable frequency oscillator is variably controlled in correspondence with the phase error signal so as to allow the clock signal to be synchronized with the pulse train;
an absolute value circuit which determines absolute values of phase errors consecutively outputted from the phase comparator;
a first average value circuit which determines an average value of the absolute values of the phase errors which are consecutively determined, or which determines a value corresponding to the average value; and
a second average value circuit which determines an average value of phase errors consecutively outputted from the phase comparator, or which determines a value corresponding to the average value,
wherein the values determined by the first average value circuit and the second average value circuit are respectively outputted as measured values of first and second parameters of the time-base error of the pulse train;
a beam-power adjusting circuit which adjusts recording beam power of a laser beam;
a time-base correcting circuit which corrects time base of a recording laser-beam drive signal; and
a control circuit which controls such that an amount of time-base correction of the recording laser-beam drive signal is set to a predetermined tentative value prior to recording of an optical disk, test recording is effected with respect to the optical disk while consecutively varying the recording beam power of the laser beam, the test recording is reproduced after the test recording, a value of the first parameter of the time-base error of the reproduced pulse train is measured by the measuring circuit, an appropriate value of the recording beam power of the laser beam during actual recording is determined on the basis of the measured value, a value of the second parameter of the time-base error of the reproduced pulse train is measured by the measuring circuit with respect to the test recording recorded with appropriate beam power, the amount of time-base correction of the recording laser-beam drive signal during actual recording is determined on the basis of the measured value, the recording beam power of the laser beam is set to the appropriate value, and the amount of time-base correction of the recording laser-beam drive signal is set to the value so as to effect actual recording.

18. A measuring circuit for measuring a parameter of a time-base error of a pulse train, the measuring circuit comprising:
   a phase-locked loop including:
   variable frequency oscillating means, and
   phase comparing means for comparing phases of an inputted pulse train and a clock signal based on an oscillation output of the variable frequency oscillating means to output a phase error signal,
   wherein an oscillation frequency of the variable frequency oscillating means is variably controlled in correspondence with the phase error signal so as to allow the clock signal to be synchronized with the pulse train;
   absolute value determining means for determining absolute values of phase errors consecutively outputted from the phase comparing means;
   first average value determining means for determining an average value of the absolute values of the phase errors which are consecutively determined, or determining a value corresponding to the average value; and
   second average value determining means for determining an average value of phase errors consecutively outputted from the phase comparing means, or determining a value corresponding to the average value,
   wherein the values determined by the first average value determining means and the second average value determining means are respectively outputted as measured values of first and second parameters of the time-base error of the pulse train.

19. A measurement circuit which measures a value of a time base error of pulses in a pulse train, the measurement circuit comprising:
   a switching circuit which selectively supplies one of a pulse train shaped from a return-light reception signal of a reading laser-beam during reproducing and a pulse-train shaped form from a return-light reception signal of a recording laser-beam during recording;
   a phase-locked loop including a phase comparator and a variable frequency oscillator, wherein the phase comparator receives the pulse train from the switching circuit and a clock signal and outputs a phase error signal corresponding to a phase difference between the pulse train and the clock signal, and wherein the variable frequency oscillator outputs the clock signal to the phase comparator and variably controls the frequency of the clock signal based on the phase error signal so as to allow the clock signal to be synchronized with the pulse train;
   an absolute value circuit which determines absolute values of the phase error signal consecutively output from the phase comparator; and
   an average value circuit which determines an average value of the absolute values of the phase error signal which is consecutively determined, or which determines a value corresponding to the average value,
   wherein the value determined by the average value circuit is output as a measured value of a time-base error of the pulse train.

20. The measurement circuit according to claim 19, wherein the pulse train shaped from the return-light reception signal of the reading laser-beam during reproducing is an EFM signal.

21. The measurement circuit according to claim 19, wherein the switching circuit having a pulse-train reproducing circuit generates a WEFM signal, as the pulse train shaped the return-light reception signal of the laser beam, by comparing the return light signal with a predetermined reference signal.

* * * * *